(12) United States Patent
Chang et al.

(10) Patent No.: US 8,422,273 B2
(45) Date of Patent: Apr. 16, 2013

(54) NANOWIRE MESH FET WITH MULTIPLE THRESHOLD VOLTAGES

(75) Inventors: Josephine Chang, Yorktown Heights, NY (US); Paul Chang, Hopewell Junction, NY (US); Michael A. Guillorn, Yorktown Heights, NY (US); Jeffrey Sleight, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 556 days.

(21) Appl. No.: 12/470,159

(22) Filed: May 21, 2009

(65) Prior Publication Data

US 2010/0295022 A1 Nov. 25, 2010

(51) Int. Cl.
*G11C 11/00* (2006.01)

(52) U.S. Cl.
USPC ............. 365/151; 365/157; 365/164; 257/24; 977/943

(58) Field of Classification Search .................. 257/1, 4, 257/9, 13, 14, 24, 40, 213, 253, 290, 292, 257/324, 329, 347, 365, 368; 331/154; 333/185; 365/80, 151, 157, 164; 438/99, 151, 197, 438/275, 585, 641, 674; 702/20; 706/33; 977/943
See application file for complete search history.

(56) References Cited

U.S. PATENT DOCUMENTS

| | | | |
|---|---|---|---|
| 6,998,722 B2 | 2/2006 | Madurawe | |
| 7,492,015 B2 | 2/2009 | Chen et al. | |
| 7,534,675 B2 * | 5/2009 | Bangsaruntip et al. | 438/197 |
| 7,795,677 B2 * | 9/2010 | Bangsaruntip et al. | 257/347 |
| 7,893,492 B2 | 2/2011 | Bedell et al. | |
| 2004/0136866 A1 | 7/2004 | Pontis et al. | |
| 2005/0072967 A1 | 4/2005 | Kornilovich et al. | |
| 2006/0091481 A1 | 5/2006 | Li et al. | |
| 2007/0017439 A1 | 1/2007 | Xianyu et al. | |
| 2007/0102747 A1 | 5/2007 | Chen et al. | |
| 2007/0111419 A1 | 5/2007 | Doyle et al. | |
| 2007/0195616 A1 | 8/2007 | Fallah et al. | |
| 2008/0135949 A1 | 6/2008 | Lo et al. | |

(Continued)

FOREIGN PATENT DOCUMENTS

WO WO2008034850 3/2008

OTHER PUBLICATIONS

Cho et al., "Observation of Single Electron Tunneling and Ballistic Transport in Twin Silicon Nanowire MOSFETs (TSNWFETs) Fabricated by Top-Down CMOS Process," Electron Devices Meeting, 2006, pp. 1-4) (Dec. 2006).

(Continued)

*Primary Examiner* — Harry W Byrne
(74) *Attorney, Agent, or Firm* — Vazken Alexanian; Michael J. Chang, LLC (57) ABSTRACT

Nanowire-based field-effect transistors (FETs) and techniques for the fabrication thereof are provided. In one aspect, a FET is provided having a plurality of device layers oriented vertically in a stack, each device layer having a source region, a drain region and a plurality of nanowire channels connecting the source region and the drain region, wherein one or more of the device layers are configured to have a different threshold voltage from one or more other of the device layers; and a gate common to each of the device layers surrounding the nanowire channels.

9 Claims, 7 Drawing Sheets

U.S. PATENT DOCUMENTS

| | | |
|---|---|---|
| 2008/0212361 A1 | 9/2008 | Bertin et al. |
| 2008/0315309 A1 | 12/2008 | Chang et al. |
| 2009/0057762 A1* | 3/2009 | Bangsaruntip et al. ....... 257/347 |
| 2009/0061568 A1* | 3/2009 | Bangsaruntip et al. ....... 438/151 |
| 2010/0264497 A1 | 10/2010 | Chang et al. |

OTHER PUBLICATIONS

Suk, et al., "Investigation of Nanowire Size Dependency on TSNWFET," Electron Devices Meeting, IEEE International, pp. 891-894 (2007).

* cited by examiner

NANOWIRE MESH FET WITH MULTIPLE THRESHOLD VOLTAGES

CROSS-REFERENCE TO RELATED APPLICATIONS

This application is related to the commonly owned U.S. application Ser. No. 12/371,943, entitled "Nanowire Mesh Device and Method of Fabricating Same," filed on Feb. 17, 2009, the contents of which are incorporated by reference herein.

FIELD OF THE INVENTION

The present invention relates to nanowire-based devices, and more particularly, to multiple threshold voltage ($V_t$) nanowire-based field-effect transistors (FETs) and techniques for the fabrication thereof.

BACKGROUND OF THE INVENTION

Gate-all-around (GAA) nanowire channel field-effect transistors (FETs) enable feature scaling beyond current planar complementary-metal-oxide semiconductor (CMOS) technology. In its basic form, a nanowire-based FET includes a source region, a drain region and nanowire channels between the source and drain regions. A gate which surrounds the nanowire channels regulates electron flow through the nanowire channels between the source and drain regions.

Feature size scaling, however, poses a challenge for today's high performance, high-power electronic devices. Take as an example, battery-powered mobile devices such as laptop computers. Without power management provisions in place, normal computing operations would quickly deplete power stores.

Many power management strategies exist at the chip level, such as powering down non-active blocks or reducing supply voltage ($V_{dd}$) during a "sleep mode." However, most of these approaches involve design overhead in terms of either managing the power-down and/or designing the circuits robustly so that they will maintain state at a lowered $V_{dd}$, where compact models typically have poor accuracy. As a result, conventional devices will almost always incur higher design and production costs to ensure the circuits function at lower $V_{dd}$. These costs arise both from checking the design itself over a wider range of voltages, as well as ensuring that the device produced is well calibrated across this range of $V_{dd}$'s. Plus, there is also the risk that if these tasks are not performed correctly, the costs associated with a re-design cycle might also be incurred.

Therefore, scalable nanowire-based FET designs that permit power consumption regulation would be desirable.

SUMMARY OF THE INVENTION

The present invention provides nanowire-based field-effect transistors (FETs) and techniques for the fabrication thereof. In one aspect of the invention, a FET is provided having a plurality of device layers oriented vertically in a stack, each device layer having a source region, a drain region and a plurality of nanowire channels connecting the source region and the drain region, wherein one or more of the device layers are configured to have a different threshold voltage from one or more other of the device layers; and a gate common to each of the device layers surrounding the nanowire channels.

In another aspect of the invention, a method of fabricating a FET is provided having the following steps. A plurality of device layers are formed oriented vertically in a stack, each device layer having a source region, a drain region and a plurality of nanowire channels connecting the source region and the drain region. One or more of the device layers are configured to have a different threshold voltage from one or more other of the device layers. A gate common to each of the device layers is formed surrounding the nanowire channels.

A more complete understanding of the present invention, as well as further features and advantages of the present invention, will be obtained by reference to the following detailed description and drawings.

DETAILED DESCRIPTION OF PREFERRED EMBODIMENTS

FIGS. 1-12 are diagrams illustrating an exemplary methodology for fabricating a gate-all-around (GAA) nanowire-based field-effect transistor (FET) having multiple threshold voltages ($V_t$'s). As will be described in detail below, the fabrication process makes use of a damascene gate process to construct source/drain regions that are self-aligned with the gate.

One goal of the present techniques is to provide nanowire-based FETs, and processes for fabricating the same, with 'tunable' $V_t$'s. Being able to regulate $V_t$ in a device can advantageously lead to power savings without the commonly encountered performance degradation. By way of example only, an electronic device having FETs with two different $V_t$'s (e.g., $V_{t2} < V_{t1}$) can be operated effectively in both a low power mode when a supply voltage $V_{dd}$ is $V_{t2} < V_{dd} < V_{t1}$, and in a high power mode when $V_{dd}$ is increased above $V_{t1}$.

Figure 1:
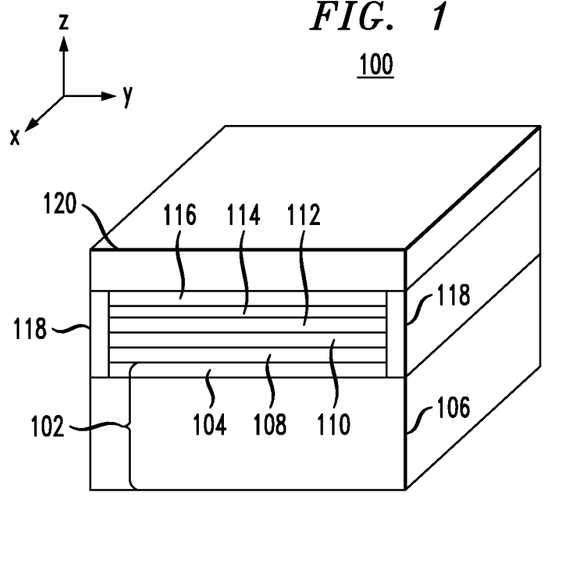
FIG. 1 is a cross-sectional diagram illustrating a starting structure for fabricating a field-effect transistor (FET) having multiple threshold voltages ($V_t$'s) according to an embodiment of the present invention.

FIG. 1 is a cross-sectional diagram illustrating a starting structure 100 for the FET fabrication. To form structure 100, shallow trench isolation (STI) is used to define an active area in a silicon-on-insulator (SOI) wafer. Namely, a wafer 102 is provided having an SOI layer 104 over a buried oxide (BOX) layer 106. According to an exemplary embodiment, SOI layer 104 has a thickness of from about five nanometers (nm) to about 20 nm. An SOI wafer commonly also includes other layers, such as a substrate, which are not shown in this depiction. BOX layer 106 can comprise any suitable insulator material including, but not limited to, dielectric materials, such as silicon dioxide ($SiO_2$). While FIG. 1 illustrates the formation of a single active area, it is to be understood that a plurality of active areas may be formed in a single wafer.

An alternating series of silicon (Si) and sacrificial layers are then formed, e.g., epitaxially grown, on the wafer in a vertical stack, with SOI layer 104 as the first layer in the series/stack. Specifically, starting with SOI layer 104 and moving upward, a first sacrificial layer 108 is epitaxially grown over SOI layer 104.

Sacrificial layer 108 comprises a crystalline material which can be etched selectively to Si, such as silicon germanium (SiGe). Sacrificial layer 108 can contain a high concentration of dopants which, when introduced into Si (by way of an anneal performed later on in the process), result in either n-type or p-type Si. For example, phosphorous (P) or arsenic (As) are typical n-type dopants and boron (B) is a typical p-type dopant. Dopant concentrations of from about $1 \times 10^{19}$ atoms per cubic centimeter (atoms/cm$^3$) to about $1 \times 10^{22}$ atoms/cm$^3$ may be employed. The doping may be performed in-situ (i.e., dopants are incorporated during the growth of sacrificial layer 108) or ex-situ (after the growth of sacrificial layer 108 using techniques such as ion implantation), with ex-situ doping being preferred if adjacent n-type and p-type doped regions are needed to form adjacent NFETs and PFETs in the same layer.

An optional undoped crystalline Si layer 110 may be epitaxially grown over sacrificial layer 108. Further, one or more additional sacrificial layers and/or crystalline Si layers may optionally be epitaxially grown in an alternating fashion on top of Si layer 110, in which the properties of the additional sacrificial layer(s) are the same as sacrificial layer 108, and the properties of the additional crystalline Si layer(s) are the same as Si layer 110. For illustrative purposes and ease of depiction, one additional sacrificial layer 112 is shown on top of Si layer 110. However, as highlighted above, these layers are optional, and embodiments are anticipated herein where these layers are not present. Further, more or fewer of these layers may be present than are shown. According to an exemplary embodiment, sacrificial layers 108 and 112 are doped the same as one another.

In the exemplary configuration shown depicted in FIG. 1, a crystalline Si layer 114 is next epitaxially grown over sacrificial layer 112. As will be described in detail below, Si layer 114 is preferably thinner than SOI layer 104 and Si layer 110. Varying the thickness of Si layer 114, and hence of the nanowire channels to be formed therein, permits multiple $V_t$'s to be present in the same FET device due to quantum confinement effects. According to an exemplary embodiment, the FET device is configured to have a first threshold voltage $V_{t1}$ and a second threshold voltage $V_{t2}$ (a dual $V_t$ device), i.e., resulting from the use of two different device layer thicknesses.

Each sacrificial layer may be deposited by way of an epitaxial growth process. As such, each sacrificial layer comprises a single crystalline material. According to an exemplary embodiment, each sacrificial layer has a thickness of from about five nm to about 20 nm. To minimize parasitic capacitance, the thickness of each sacrificial layer should be as small as possible while still leaving enough room for a dielectric/gate to fit in the gap formed once the sacrificial layer is removed later on in the process.

Similarly, each Si layer may also be deposited by way of an epitaxial growth process. As such, each Si layer also comprises a single crystalline material. According to an exemplary embodiment, Si layer 110 has a thickness of from about five nm to about 20 nm (i.e., the same thickness as SOI layer 104). As highlighted above, Si layer 114 is thinner than SOI layer 104 and Si layer 110. According to an exemplary embodiment, Si layer 114 has a thickness of from about one nm to about 10 nm. A thinner Si layer 114 may be achieved by regulating the amount of deposited material and/or by grinding or etching the layer down to a desired thickness.

According to an exemplary embodiment, an epitaxial growth process is used to form both the Si and sacrificial layers. The epitaxial growth is performed at a temperature of less than about 800 degrees Celsius (° C.), e.g., less than about 650° C. The process can be carried out without breaking vacuum between the growth of each layer, or alternatively, vacuum can be broken between layers to enable extra processing, e.g., ex-situ doping of the sacrificial layers. Notwithstanding whether the vacuum is broken or not between layers, a purge step is preferably performed between each successive layer formation. The growth pressure employed in forming each of the Si and sacrificial layers is less than about 100 torr, e.g., less than about 50 torr. It is notable that with these exemplary epitaxial growth parameters the thickness of each of the Si and sacrificial layers should vary by no more than about five percent (%). As highlighted above, nanowire channels will be formed in the Si layers later on in the fabrication process, and the thickness of each sacrificial layer will determine a distance between adjacent nanowire channels in a z-direction.

A first hardmask 116 is deposited over Si layer 114. According to an exemplary embodiment, hardmask 116 comprises an oxide, such as $SiO_2$, and is deposited over Si layer 114 using chemical vapor deposition (CVD) or plasma enhanced CVD (PECVD).

STI is used to planarize and isolate the Si/sacrificial layer stack to an active area of the wafer. STI involves common lithography and etching processes which are well known to those of skill in the art, and thus are not described further herein. STI is generally employed with process technology in the nanometer feature size range. A nitride liner 118 is formed adjacent to one or more sidewalls of the stack using a deposition process, such as CVD, PECVD or atomic layer deposition (ALD). The stack now formed in the active area of the wafer will be used later in the process to form source and drain regions and nanowire channels of the FET device. The arrangement of the various layers in the stack defines the location of the nanowire channels in the z-direction.

A second hardmask 120 is then deposited over the stack. According to an exemplary embodiment, hardmask 120 comprises a nitride, such as silicon nitride (SiN) and is deposited using low-pressure chemical vapor deposition (LPCVD) to a thickness of from about 15 nm to about 20 nm, e.g., about 20 nm. As will be described in detail below, hardmask 116 and hardmask 120 will be patterned (in accordance with a desired location of the nanowire channels in the x-direction) into a plurality of individual nanowire hardmasks.

Figure 2:
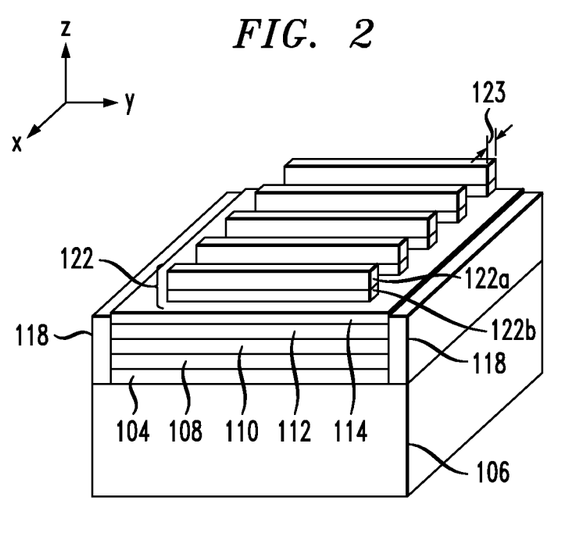
FIG. 2 is a cross-sectional diagram illustrating a plurality of nanowire hardmasks according to an embodiment of the present invention.

FIG. 2 is a cross-sectional diagram illustrating the first hardmask 116 and the second hardmask 120 patterned into a plurality of individual nanowire hardmasks 122. As highlighted above, the patterning of the hardmasks is commensurate with a desired location of the nanowires. According to an exemplary embodiment, a resist film (not shown) is deposited on hardmask 120 and patterned with the footprint and location of each of the nanowire hardmasks 122. In one example, reactive ion etching (RIE) (see below) is used to form the nanowire hardmasks, and therefore the resist film comprises a resist material such as hydrogen silsesquioxane (HSQ) patterned using electron beam (e-beam) lithography and transferred to a carbon-based resist.

A hardmask open stage is then performed using a series of selective RIE steps based on the fact that the first hardmask comprises an oxide, while the second hardmask comprises a nitride. For example, a nitride-selective RIE using the resist film (not shown) as a mask is first used to remove all but the portions of hardmask 120 thereunder, defining a nitride portion 122a of the nanowire hardmasks. Hardmask 116, which comprises an oxide, acts as an etch stop for the nitride-selective RIE. The nitride-selective RIE can also at the same time etch nitride liner 118, with Si layer 114 acting as an etch stop.

Next, using the nitride portion as a mask, an oxide-selective RIE is used to remove all but the portions of hardmask 116 beneath the nitride mask, defining an oxide portion 122b of the nanowire hardmasks. Si layer 114 acts as an etch stop for the oxide-selective RIE. In this example, the nitride portions 122a and the oxide portions 122b of the nanowire hardmasks each have thicknesses of from about 15 nm to about 20 nm, e.g., about 20 nm.

Nitride portions 122a and oxide portions 122b form a dual nanowire hardmask structure. The use of a dual nanowire hardmask structure permits more precise and uniform nanowires to be formed in the Si layers. Namely, with the dual hardmask structure, the nitride portion 122a protects the integrity of the oxide portion 122b during dummy gate definition (see FIG. 3, described below), and the oxide portion 122b protects the nanowire channels during spacer (nitride-selective) etch (see description below). Maintaining good integrity of the nanowire hardmasks is important for minimizing variations in nanowire dimensions. As device sizes become increasingly smaller, the effect of unwanted dimensional variations becomes even more pronounced.

In this example, the nanowire hardmasks 122 are configured to have a pitch, i.e., a spatial frequency, of less than about 200 nm, for example, from about 10 nm to about 200 nm, e.g., from about 40 nm to about 50 nm. To maximize layout density and minimize parasitic capacitance, the pitch should be as small as possible within patterning and processing limits. To achieve pitches smaller than what can be defined by direct lithography, a pitch doubling technique such as sidewall image transfer or double patterning/double etching can be used. A width 123 of each nanowire hardmask 122 is less than about 40 nm, for example, from about five nm to about 40 nm, e.g., from about five nm to about 20 nm. The pitch/width of each nanowire hardmask 122 will initially determine a pitch/width of each nanowire channel. However, as will be presented below, the width of the nanowire channels in one or more layers of the device can be further thinned (beyond what is defined by the nanowire hardmasks) using a lateral thinning process.

Figure 3:
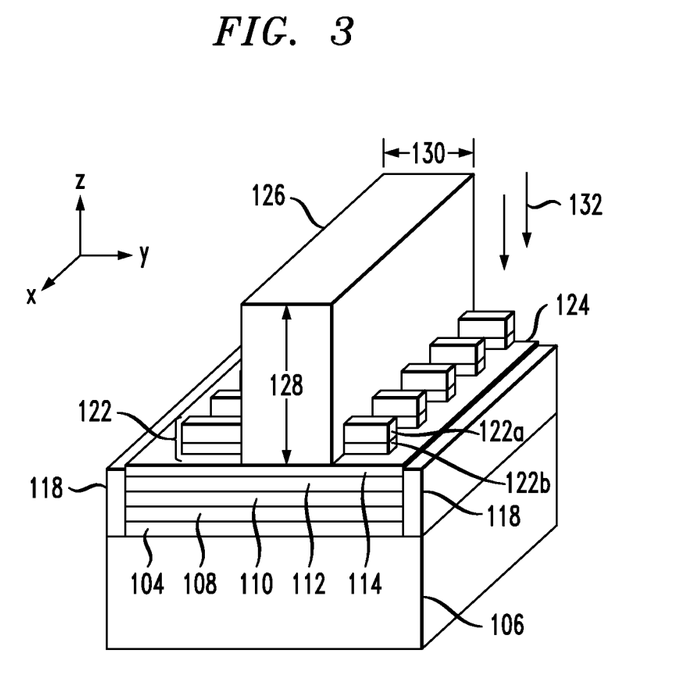
FIG. 3 is a cross-sectional diagram illustrating a dummy gate structure formed over an active area of the FET according to an embodiment of the present invention.

FIG. 3 is a cross-sectional diagram illustrating a dummy gate structure 126 formed over the active area. Prior to forming the dummy gate, an oxide stopping layer, i.e., oxide layer 124, is formed on Si layer 114. According to an exemplary embodiment, thermal oxidation is used to grow oxide layer 124 to a thickness of up to about four nm, e.g., up to about two nm. This thermal oxidation process is another way by which Si layer 114 can be thinned to its desired thickness, since a portion of Si layer 114 is consumed during the thermal oxidation process (a thickness of Si layer 114 may be reduced for example by about two nm, e.g., by up to about one nm).

To begin the damascene gate process, dummy gate structure 126 is formed. As will be apparent from the description that follows, the dummy gate structure 126 defines a location of the nanowires in a y-direction, as well as a location of a gate of the final FET device structure. According to an exemplary embodiment, the dummy gate structure comprises polycrystalline Si (polysilicon).

Dummy gate structure 126 can be formed by the following process. A polysilicon layer is first deposited over oxide layer 124/nanowire hardmasks 122 using LPCVD to a thickness of from about 100 nm to about 150 nm, e.g., about 140 nm. Since the thickness of the polysilicon layer will determine a height of the dummy gate, chemical-mechanical polishing (CMP) may be used after deposition to achieve a desired thickness/height. A resist film (not shown) is deposited on the polysilicon layer, masked and patterned with a footprint and location of the dummy gate structure. Polysilicon-selective ME is then used to remove all but a portion of the polysilicon layer under the mask, i.e., that portion located over the nanowire hardmasks (centered over the nanowire hardmasks in the y-direction), which is dummy gate structure 126. According to an exemplary embodiment, dummy gate 126 has a height 128 of from about 100 nm to about 150 nm, e.g., about 140 nm, and a length 130 of from about 30 nm to about 50 nm, e.g., about 45 nm.

As indicated by arrows 132, a top-down implant may optionally be used to dope Si layer 114 and potentially also Si layer 110 and SOI layer 104 therebelow. The conditions for this implant are well known to those skilled in the art and may vary depending on the type of dopant species employed. The top-down implant may be used, for example, when the sacrificial layers were not doped earlier in the process, or where the amount of doping that will be obtained from the sacrificial layers (during a diffusion/activation anneal described below) is not sufficient and the top-down implant is used to supplement that doping.

Figure 4:
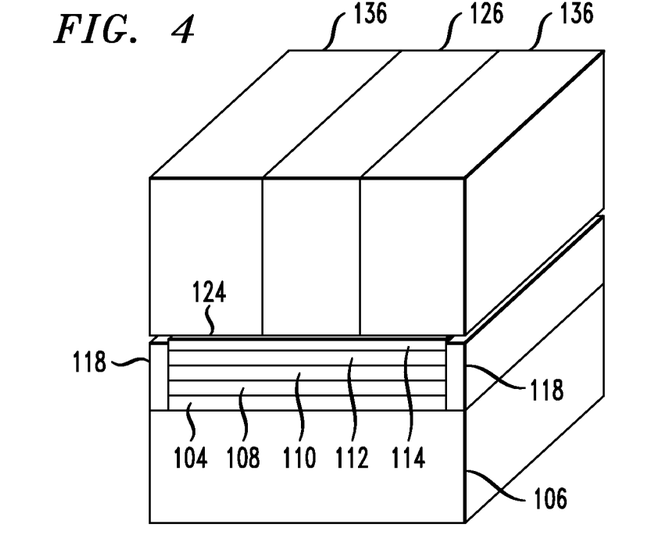
FIG. 4 is a cross-sectional diagram illustrating a filler layer deposited around the dummy gate according to an embodiment of the present invention.

FIG. 4 is a cross-sectional diagram illustrating a (sacrificial) filler layer 136 deposited around the dummy gate 126. Filler layer 136 can comprise any suitable filler material, including but not limited to, a dielectric material, such as $SiO_2$. According to an exemplary embodiment, the filler layer 136 is deposited around dummy gate 126 using a high-density plasma (HDP). CMP is then used to planarize the filler material, using the dummy gate as an etch stop. Thus, filler layer 136 will have a thickness equivalent to the height of the dummy gate, e.g., from about 100 nm to about 150 nm, e.g., about 140 nm.

Figure 5:
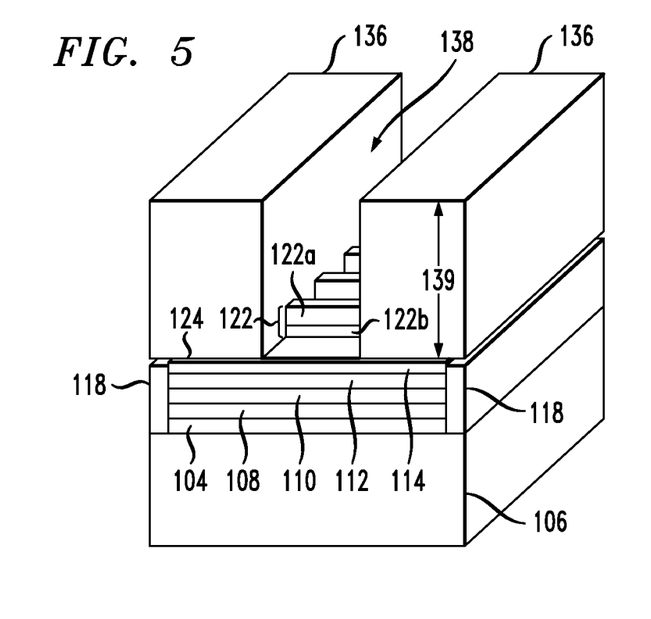
FIG. 5 is a cross-sectional diagram illustrating the dummy gate removed resulting in a trench being formed in the filler layer according to an embodiment of the present invention.

FIG. 5 is a cross-sectional diagram illustrating the dummy gate having been removed. Dummy gate 126 can be removed using a chemical etching process, such as chemical down stream or potassium hydroxide (KOH) etching, or RIE. As shown in FIG. 5, removal of dummy gate 126 results in a trench 138 being formed in filler layer 136. Since trench 138 is a negative pattern of dummy gate 126, trench 138 is also centrally located (i.e., in a y-direction) over nanowire hardmasks 122. According to an exemplary embodiment, trench 138 distinguishes a (nanowire) channel region of the device from source and drain regions of the device.

The etching may also have an effect on the filler layer 136, removing a portion thereof. For example, after the etch process to remove dummy gate 126, filler layer 136 can be reduced to a thickness 139 of from about 30 nm to about 125 nm, e.g., about 80 nm.

The use of a dummy gate is an important aspect of the present techniques. Namely, the dummy gate allows for the nanowire hardmasks to be placed prior to the filler layer, such that when the dummy gate is removed, the nanowire hardmasks revealed are already present within the trench. The nanowire hardmasks are important for more precise and uniform nanowires to be formed in the active region.

Figure 6:
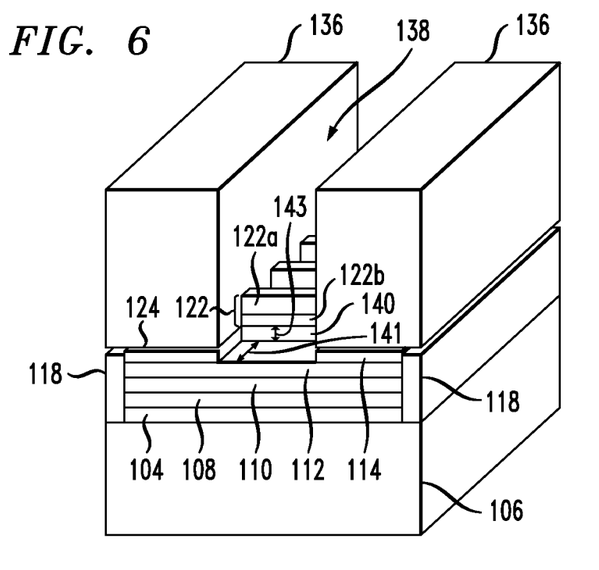
FIG. 6 is a cross-sectional diagram illustrating nanowire bars etched into a thinner top device layer according to an embodiment of the present invention.

FIG. 6 is a cross-sectional diagram illustrating nanowire bars 140 (precursors to nanowire channels of the device) etched into the thinner, top most Si layer(s), e.g., Si layer 114. The term "bar" is used to refer to an as-etched nanowire structure, prior to any further processing (e.g., thinning and/or suspending) that results in a completed nanowire channel of the FET device. Further, the Si layers are also referred to herein as device layers, since each Si layer will be used to form a source and drain region and nanowire channels of the FET device (i.e., each device layer will have a source region, a drain region and nanowire channels connecting the source and drain regions). It is notable that while the instant description provides that the thinner device layer is the single, top-most Si layer of the Si layer/sacrificial layer stack, this configuration is merely exemplary. For example, the stack may comprise more Si/sacrificial layers than shown, with more than one of the top Si layers being thinner than the other layers in the stack.

According to an exemplary embodiment, a Si-selective RIE is used to remove portions of Si layer 114 within trench 138 not masked by the nanowire hardmasks 122. The underlying sacrificial layer 112 acts as an etch stop. The nanowire bars 140 patterned in this manner will have sharp, well-defined edges. As described above, this is a result of using dual (nitride/oxide) hardmasks to pattern the nanowires. By way of example only, the nanowire bars formed in this manner can have a pitch, i.e., a spatial frequency, based on the pitch of the nanowire hardmasks of less than about 200 nm, for example, from about 10 nm to about 200 nm, e.g., from about 40 nm to about 50 nm. Further, at this point in the process, the nanowire bars 140 will each have a width 141 defined by a width of the nanowire hardmasks 122, i.e., of less than about 40 nm, for example, from about five nm to about 40 nm, e.g., from about five nm to about 20 nm, and a thickness 143 defined by a thickness of Si layer 114, i.e., of from about one nm to about 10 nm. However, the widths of the nanowire bars may be further reduced, e.g., by a lateral thinning process, as described in detail below.

An advantage of the present teachings is that nanowire bars are etched only within trench 138, leaving the source/drain regions of the device intact below filler layer 136. Further, the source/drain regions produced in this manner will be self-aligned with trench 138 and thus with a device gate that will be formed in trench 138 (see description below).

Figure 7:
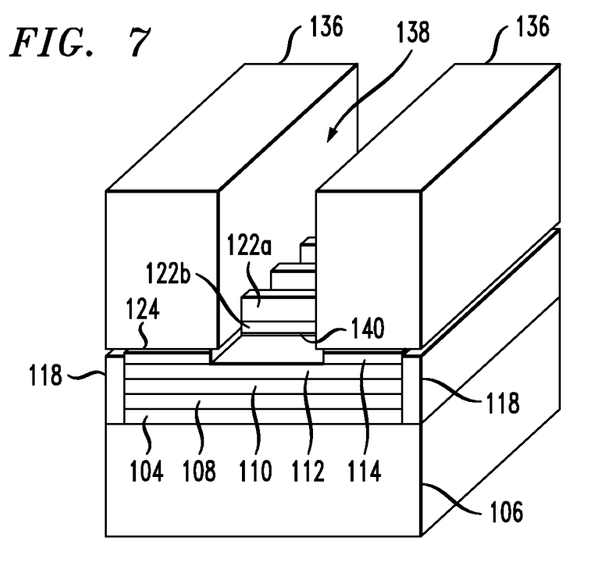
FIG. 7 is a cross-sectional diagram illustrating the nanowire bars formed in FIG. 6 thinned laterally according to an embodiment of the present invention.

FIG. 7 is a cross-sectional diagram illustrating nanowire bars 140 thinned laterally. Specifically, as shown in FIG. 7, nanowire bars 140 are thinned laterally, decreasing their widths to be less than the width of the nanowire hardmasks 122.

When the dimensions of the nanowire channels become very small, $V_t$ can be modulated by dimension, due to quantum effects. In the present fabrication process, the dimensions of the nanowire channels are initially determined by two things, namely the thickness of the corresponding Si layer and the width of the nanowire hardmasks used to pattern the nanowire bars. So if each of the Si layers has a thickness x, and the nanowire hardmasks have a width y, then the as-patterned nanowire bars would also have a thickness x and a width y. With the present teachings however, in order to attain a multiple $V_t$ configuration, it is desired that the top-most nanowire bar(s), e.g., nanowire bars 140, have smaller (width and thickness) dimensions. To do so, the top Si layer(s), e.g., Si layer 114, is made thinner than the other Si layers in the initial structure (see description above), which will result in nanowire bars 140 being thinner than the other nanowire bars formed later in the process in the other device layers. To decrease the width of nanowire bars 140 (without affecting the other device layers), selective etching is used to first form nanowire bars 140 (as shown in FIG. 6 and as described above) leaving the other device layers untouched. Nanowire bars 140 are then thinned laterally (narrowed), e.g., by oxidation of all exposed Si surfaces (namely the exposed surfaces of nanowire bars 140), to decrease their widths. The nanowire hardmasks 122 will not be affected by the oxidation, nor will any of the other device layers because they are not exposed. After the lateral thinning, nanowire bars 140 can each have a width of from about one nm to about 10 nm.

The oxidation can be conducted using any Si oxidation process that produces a $SiO_2$ film of suitable thickness. Such techniques include furnace-based oxidation, rapid thermal oxidation and oxygen or ozone plasma-based oxidation.

Figure 8:
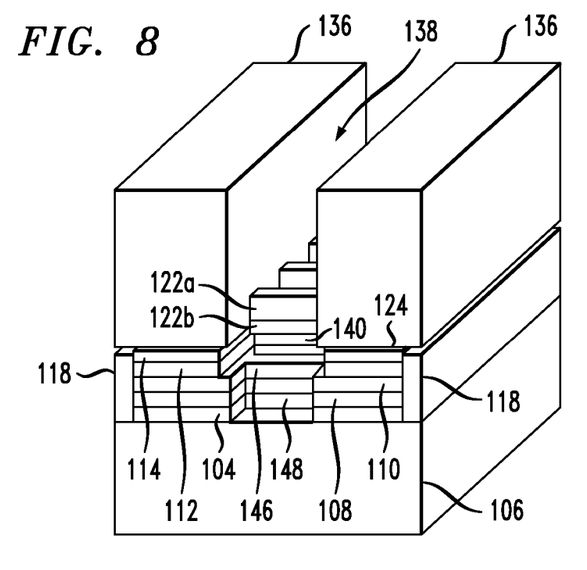
FIG. 8 is a cross-sectional diagram illustrating nanowire bars etched into the remaining thicker device layers according to an embodiment of the present invention.

FIG. 8 is a cross-sectional diagram illustrating nanowire bars 146 and 148 etched into the remaining, thicker layers of the device, i.e., Si layer 110 and SOI layer 104, respectively. As highlighted above, the nanowire bars are precursors to the nanowire channels of the device. As shown in FIG. 8, the nanowire bars are in a stacked configuration with nanowire bars 140 above nanowire bars 146, and nanowire bars 146 above nanowire bars 148.

According to an exemplary embodiment, a series of Si-selective and oxide-selective RIE steps are used to remove portions of Si layer 110/SOI layer 104 and sacrificial layers 108/112, respectively, within trench 138 not masked by the nanowire hardmasks 122. The underlying layer acts as an etch stop during each RIE step. For example, during the (Si-selective) RIE of Si layer 110, sacrificial layer 108 acts as an etch stop. As described above, the use of a dual (nitride/oxide) hardmask structure results in the patterned nanowires having sharp, well-defined edges. By way of example only, nanowire bars 146 and 148 formed in this manner can have a pitch, i.e., a spatial frequency of bars within the same device layer, of less than about 200 nm, for example, from about 10 nm to about 200 nm, e.g., from about 40 nm to about 50 nm. Further, the nanowire bars 146 and 148 will each have a width defined by a width of the nanowire hardmasks 122, i.e., of less than about 40 nm, for example, from about five nm to about 40 nm, e.g., from about five nm to about 20 nm. In these 'thicker' layers of the device, it is desired that the nanowire bars have a width commensurate with the width of the nanowire hardmasks.

Figure 9:
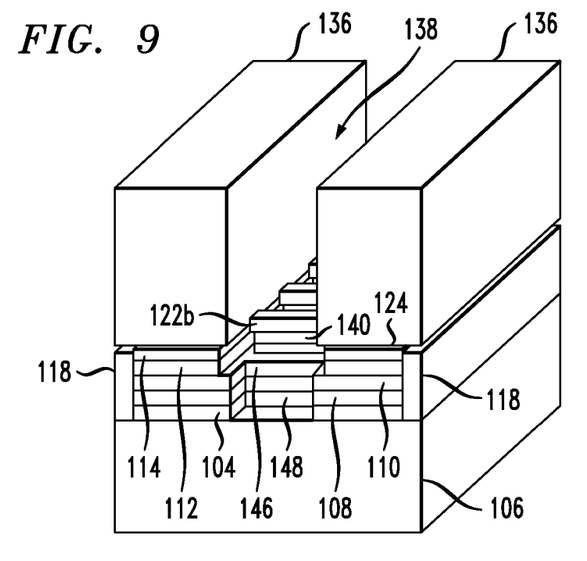
FIG. 9 is a cross-sectional diagram illustrating an exposed nitride portion of the nanowire hardmasks removed according to an embodiment of the present invention.

FIG. 9 is a cross-sectional diagram illustrating the exposed nitride portion 122a (i.e., portions within trench 138) of the nanowire hardmasks having been removed. Any etching process selective for removal of the nitride portions of the nanowire hardmasks relative to the oxide portions may be used. Ideally, however, the thickness of the nitride portion of the nanowire hardmasks should have been chosen such that it is mostly consumed during the previous bar etch, so there should not be much left on the structure at this point. The oxide portion 122b of the hardmask is ideally designed so that it is entirely consumed during the spacer etch (see FIG. 10, described below). Any of the oxide hardmask remaining after the spacer etch should be thin enough to be removed during a clean preceding gate stack deposition. The gate stack preclean is a standard process that removes organic contaminants, metallic contaminants and any native oxide on the surface of the Si. The native oxides can be removed using either a wet or dry chemical etch process for removing oxide. An example would be 100:1 dilute hydrofluoric acid (HF).

Figure 10:
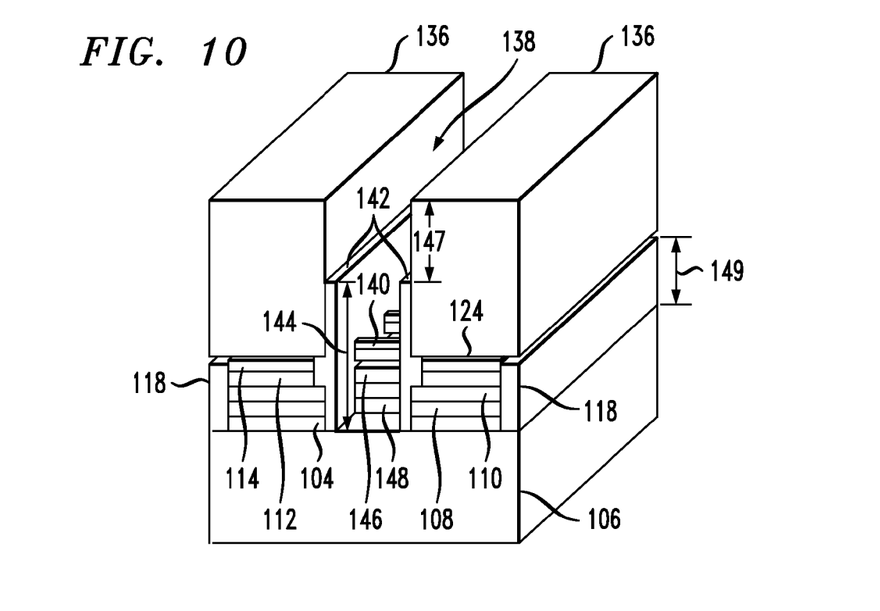
FIG. 10 is a cross-sectional diagram illustrating spacers formed in the trench according to an embodiment of the present invention.

FIG. 10 is a cross-sectional diagram illustrating spacers 142 formed in trench 138. This step is optional. Placing spacers between what will be the source/drain regions of the device and the device gate (that will be formed in trench 138, see FIG. 12, described below) will help to minimize parasitic capacitance in the completed device, but is not necessary for preventing gate-to-source/drain shorting during raised source/drain (RSD) epitaxial growth or silicide, i.e., as in typical FET flows. Spacers 142 serve to offset the gate a certain distance from the source/drain regions.

According to an exemplary embodiment, spacers 142 are formed by first depositing a nitride (e.g., SiN) layer into trench 138. A resist film (not shown) is then deposited on the nitride layer, masked and patterned with a location and footprint of the spacers. A nitride-selective RIE is then used to define spacers 142 in the nitride layer. A large timed overetch is needed to clear the sidewalls of the nanowire bar stack, such that the spacers 142 are present only along the sidewalls of the trench 138 and not on the nanowire bar stack. The minimum pulldown of spacers 142 is thus the height of the nanowire bar stack and remaining (oxide portion 122b) nanowire hardmasks. For example, the amount of overetch is between about 50% and about 80% of the etch time required to remove the entire nitride layer. According to an exemplary embodiment, the spacers 142 have a width 144 of from about five nm to about 25 nm. A maximum height of the spacers 142 is equal to the thickness 139 of trench 138 less height 147 of the spacer pulldown. A minimum height of the spacers is height 149 of the nanowire bar stack. The oxide portion 122b of the hardmask is exposed during the long overetch required to remove the nitride layer, and will most likely be eroded during this step due to imperfect selectivity of the nitride etch used to remove the nitride layer. Ideally, the oxide portion 122b of the hardmask is designed to be just thick enough to be completely eroded during this step.

Figure 11:
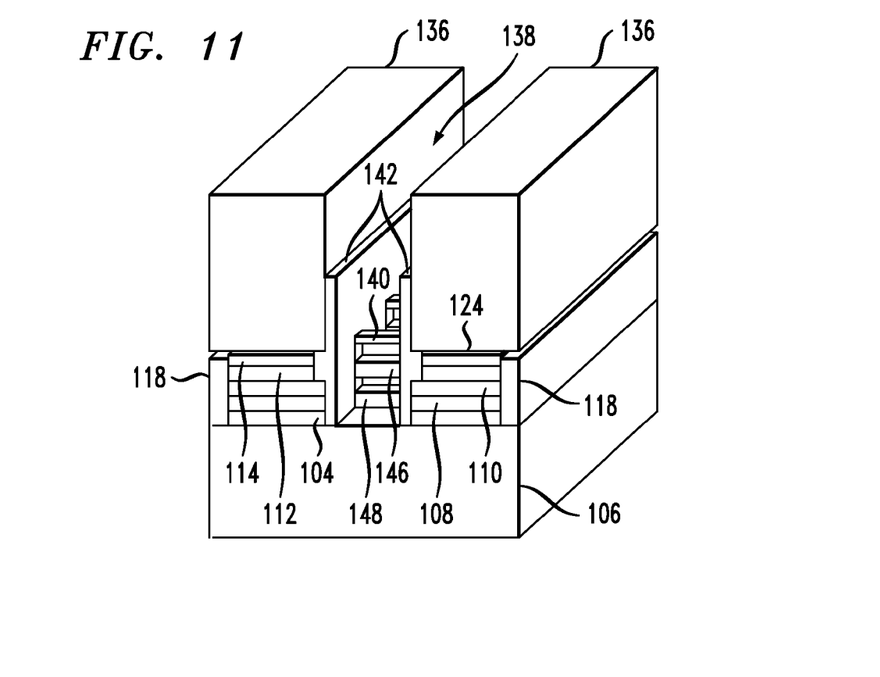
FIG. 11 is a cross-sectional diagram illustrating sacrificial layers having been removed from between the nanowire bars according to an embodiment of the present invention.

FIG. 11 is a cross-sectional diagram illustrating the sacrificial layers having been removed from between nanowire bars 140, 146 and 148. The now released nanowire bars (140 (thinned), 146 and 148) are the nanowire channels of the device. These multiple layers of nanowire channels are also referred to herein as a nanowire "mesh."

The sacrificial layers may be removed from between the nanowire bars as follows. A chemical etchant can be employed that exploits the lower oxidation potential of the sacrificial layers as compared to the Si layers. Examples of such etchants include, but are not limited to a 1:2:3 mixture of HF:hydrogen peroxide ($H_2O_2$):acetic acid ($CH_3COOH$), or a mixture of sulfuric acid ($H_2SO_4$) and $H_2O_2$. Alternatively, the sacrificial layers can be selectively removed using a dry etching process such as oxygen ($O_2$) plasma etching or plasma chemistries typically used for etching. Since the doped sacrificial layers are removed from the channel region of the FET, the nanowire channels remain undoped which is an important advantage of thin channel, fully depleted devices such as nanowire FETs.

A solid source diffusion anneal, such as a rapid thermal anneal (RTA), spike anneal and/or laser anneal process, is then performed to diffuse and activate the dopants from the sacrificial layers (present now only in the source and drain regions) throughout the source/drain regions of the device layers. Temperatures for this anneal may range from about 1,000° C. to about 1,100° C., and the anneal may vary in duration from a few milliseconds (ms), for example five ms, to a few seconds, for example, five seconds. As highlighted above, the channels remain undoped.

Figure 12:
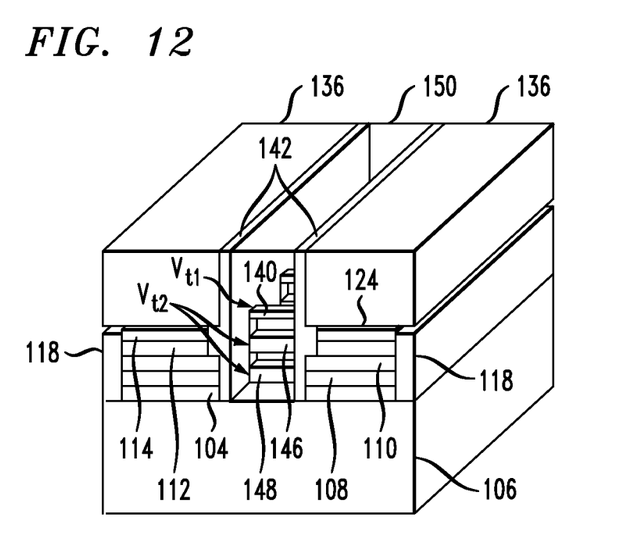
FIG. 12 is a cross-sectional diagram illustrating a replacement gate formed in the trench according to an embodiment of the present invention.

Next, as shown in FIG. 12, a cross-sectional diagram, a replacement gate 150 is formed in trench 138 surrounding the nanowire channels by filling trench 138 with a gate material. Gate 150 formed in this manner will be common to each of the device layers (i.e., a single gate for multiple device layers). Prior to placing gate 150, a wet chemical clean to remove surface contamination and native oxide is performed and a gate dielectric, e.g., $SiO_2$, is formed on the nanowire channels. The gate dielectric will separate the gate from the nanowire channels. To form the dielectric, differential chemical oxidation is used which preferentially oxidizes exposed portions of the doped SiGe while forming only an interfacial layer (the gate dielectric) on the undoped nanowire channels (doped Si oxidizes faster and more readily than undoped Si).

Once the gate material is filled into trench 138, CMP is used to planarize the gate with filler layer 136 acting as an etch stop. An overpolish may be used to planarize filler layer 136 and the gate material down to spacers 142 for a more vertical gate profile. Suitable gate materials include, but are not limited to, one or more of polysilicon, a deposited metal(s) and a hybrid stack of multiple materials such as metal polysilicon.

The FET device formed according to the above-described process has a plurality of device layers oriented vertically in a stack. Each device layer includes a source region, a drain region and a plurality of nanowires, i.e., a nanowire mesh, connecting the source and drain regions. Advantageously, one or more of the device layers will have a different $V_t$ from the other device layers. For example, in one configuration, the top-most thinner device layer(s) with thinner/narrower nanowire channels will have a first threshold voltage $V_{t1}$ and the bottom thicker device layers with thicker/wider nanowire channels will have a second threshold voltage $V_{t2}$. With this exemplary configuration, as the nanowire size (width/thickness) decreases, $V_t$ increases due to quantum effects. See, for example, Suk et al., "Investigation of Nanowire Size Dependency on TSNWFET," Electron Devices Meeting, IEEE International, pgs. 891-894 (2007) (as nanowire size (i.e., diameter) decreases, $V_t$ increases due to conduction band increases in the limited dimension of the nanowire), the contents of which are incorporated by reference herein. Thus, in this exemplary configuration, $V_{t1}$ is greater than $V_{t2}$. Other configurations based on the present teachings are also possible, e.g., wherein more than two $V_t$'s are present in the same device.

In operation, the different (multiple $V_t$) device layers may be used in parallel. For example, with a dual $V_t$ configuration wherein $V_{t1} > V_{t2}$, if the supply voltage ($V_{dd}$) is low (i.e., $V_{t1} > V_{dd} > V_{t2}$), then only the low $V_{t2}$ device layer(s) will be operational. If the $V_{dd}$ is increased (i.e., $V_{dd} > V_{t1}$), then both device layers in parallel would turn on and off (the device layers are tied together in both the source and drain regions by the conductive sacrificial layers). Not all components in a given circuit would need to be made in parallel. Only the parts one wants to speed up more as the $V_{dd}$ is raised (or the parts one wants to consume less power when the $V_{dd}$ is lowered).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of fabricating a FET, comprising the steps of:
forming a plurality of device layers oriented vertically in a stack, each device layer having a source region, a drain region and a plurality of nanowire channels connecting the source region and the drain region;
configuring one or more of the device layers to have a different threshold voltage from one or more other of the device layers; and
forming a gate common to each of the device layers surrounding the nanowire channels.

2. The method of claim 1, further comprising the steps of:
providing a silicon-on-insulator (SOI) wafer;
forming an alternating series of silicon and sacrificial layers on the wafer;
etching a stack of nanowire bars into the silicon and sacrificial layers; and
removing the sacrificial layers from the stack.

3. The method of claim 2, wherein a top layer of the stack is a silicon layer, the method further comprising the steps of:
etching the top silicon layer to form a plurality of nanowire bars therein; and
laterally thinning the nanowire bars formed in the top silicon layer.

4. The method of claim 3, wherein the top silicon layer of the stack is thinner than one or more other of the silicon layers in the stack.

5. The method of claim 2, wherein each of the sacrificial layers comprises silicon germanium, the method further comprising the step of:
doping each of the sacrificial layers with an n-type or a p-type dopant; and
diffusing the dopant from the sacrificial layers to the silicon layers in the source and drain regions of the device layers.

6. The method of claim 3, wherein the step of laterally thinning the nanowire bars formed in the top silicon layer further comprises the step of:
oxidizing the nanowire bars formed in the top silicon layer.

7. The method of claim 2, further comprising the step of:
forming a plurality of nanowire hardmasks over the stack; and
using the nanowire hardmasks as masks during the etching step to form the nanowire bars.

8. The method of claim 1, further comprising the step of:
forming a dielectric on the nanowire channels prior to forming the gate.

9. The method of claim 1, wherein one or more of the device layers are configured to have a threshold voltage $V_{t1}$ and one or more other of the device layers are configured to have a threshold voltage $V_{t2}$, the method further comprising the step of:
configuring the nanowire channels of the one or more device layers with the threshold voltage $V_{t1}$ to have at least one of a width and a thickness that is less than a width and thickness of the nanowire channels in the device layers with the threshold voltage $V_{t2}$.

* * * * *